United States Patent
Kawamura (10) Patent No.: US 7,443,155 B2
(45) Date of Patent: Oct. 28, 2008

(54) VOLTAGE DETECTING APPARATUS

(75) Inventor: Yoshihiro Kawamura, Tokyo (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/902,595

(22) Filed: Sep. 24, 2007

(65) Prior Publication Data

US 2008/0079416 A1    Apr. 3, 2008

(30) Foreign Application Priority Data

Sep. 29, 2006    (JP) .............................. 2006-267399

(51) Int. Cl.
  *G01R 19/00*    (2006.01)
  *G01R 31/327*   (2006.01)
  *G01R 27/08*    (2006.01)
(52) U.S. Cl. .................. 324/76.11; 324/416; 324/713
(58) Field of Classification Search ............. 324/76.11, 324/415, 416, 522, 713, 177, 72.5, 111; 320/162; 340/660, 662; 315/224, 225, 244, 209 R, 315/291, 307
See application file for complete search history.

(56) References Cited

U.S. PATENT DOCUMENTS 6,813,170 B2 * 11/2004 Yang ........................ 363/56.09
7,315,461 B2 *  1/2008 Kyono ..................... 363/21.06

FOREIGN PATENT DOCUMENTS

JP           2004-170146        6/2004

* cited by examiner

*Primary Examiner*—Diego Gutierrez
*Assistant Examiner*—Hoai-An D Nguyen
(74) *Attorney, Agent, or Firm*—Edwards Angell Palmer & Dodge LLP (57) ABSTRACT

A voltage detecting apparatus with a capacitor having a switch for detecting a voltage of a direct-current power source, which can detect a malfunction of the switch without additional parts and effects to a measurement time in a normal condition, is provided. When a microcomputer measures a voltage between both terminals of a capacitor plural times, the sampled voltages are at most a prescribed threshold value, and a voltage decreases at least a prescribed difference of voltages in sampling order (each of all measured voltages between both terminals decreases at least a potential deference from a voltage measured previously in sampling order). Furthermore, when the voltage between both terminals of the capacitor becomes 0 volt in condition that a fifth switch SW5 is opened, it is judged that the fifth switch is in an abnormal condition.

6 Claims, 5 Drawing Sheets

VOLTAGE DETECTING APPARATUS

The priority application Number Japan Patent Application No. 2006-267399 upon which this patent application is based is hereby incorporated by reference.

BACKGROUND OF THE INVENTION

1. Field of the Invention

The present invention relates to a voltage detecting apparatus and specifically to the voltage detecting apparatus detecting voltage of DC (direct-current) power source.

2. Description of the Related Art

Usually, as a voltage detecting apparatus detecting voltage of DC (direct-current) power source, there is an insulation detecting apparatus of Flying Capacitor method. For detecting an insulating condition of an insulation condition of the high-voltage direct-current power source, a value of earth-fault resistance is calculated based on a measured value of a voltage between both terminals of an ungrounded capacitor (i.e. flying capacitor) charged with a voltage of the high-voltage power source and a measured value of a voltage between both terminals of the capacity, one terminal of which is grounded through a resistor, similarly charged with the voltage of the high-voltage power source. Thereby, the insulation condition of the high-voltage power source can be detected. There is a Patent document 1 as references.

The insulation detecting apparatus described in the patent document 1 charges a voltage to a capacitor, and detects a malfunction of a switch on a circuit for measuring a voltage between both terminals of the capacitor.

Figure 5:
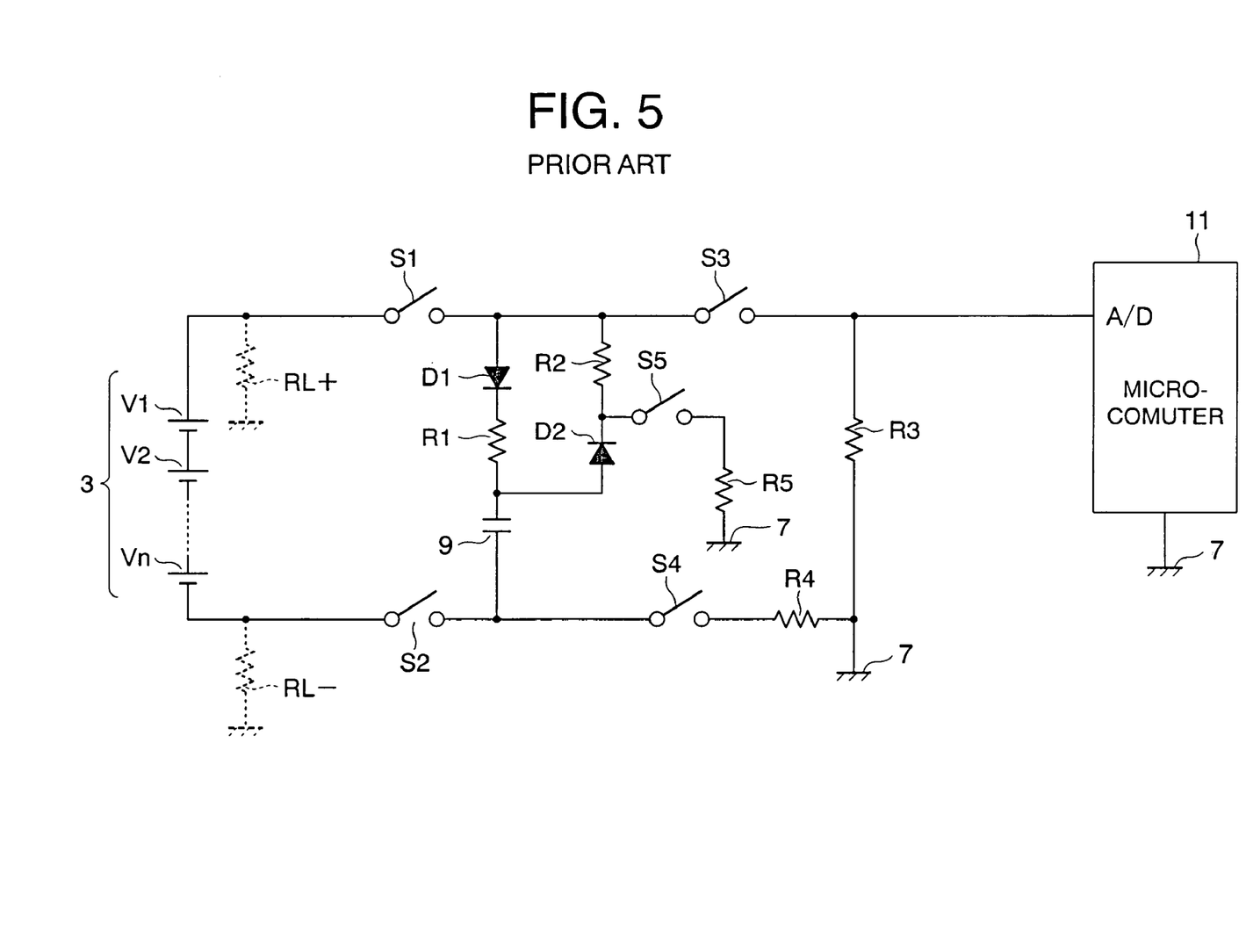
FIG. 5 is a circuit diagram of the conventional voltage detecting apparatus by prior art.

FIG. 5 is a circuit diagram of the insulation detecting apparatus described in the patent document 1. As shown in FIG. 5, the power source 3 is formed by connecting plural batteries from V1 to Vn in series. The high-voltage power source V is insulated from a ground electric potential 7 of a low-voltage system, such as a microcomputer 11.

As shown in FIG. 5, the insulation detecting apparatus has a bipolar type capacitor 9, a first switch S1 and a second switch S2. The first switch S1 connects a positive electrode of the power source 3 insulated from on the ground electric potential 7 to one terminal of the capacitor 9. The second switch S2 connects a negative electrode of the power source 3 to the other terminal of the capacitor 9.

A microcomputer 11 includes a voltage measuring function which converts a provided voltage into an input port A/D analog-to-digital and measures the voltage. The insulation detecting apparatus has a third switch S3 and a fourth switch S4. The third switch S3 connects the one terminal of the capacitor 9 to the input port A/D. The fourth switch S4 connects the other terminal of the capacitor 9 to the ground electric potential 7.

A first diode D1, a first resistor R1 and the capacitor 9 are connected in series from a point between the first switch S1 and the third switch S3 to a point between the second switch S2 and the fourth switch S4. A second diode D2 and a second resistor R2 are connected in series from a point between the first resistor R1 and the capacitor 9 to a point between the first switch S1 and the third switch S3. That is, the first diode D1/the first resistor R1 and the second diode D2/the second resistor R2 are connected in parallel.

A third resistor R3 is connected between a terminal, at side of the input port A/D, of the third switch S3 and the ground electric potential 7. A fourth resistor R4 is connected between a terminal, at side of the ground electric potential 7, of the fourth switch S4 and the ground electric potential 7.

The above mentioned first-fourth switches S1-S4 are applied with an optical MOSFET. These switches are insulated from the power source 3 and can be controlled by the microcomputer 11.

A fifth switch S5 is connected from a point between the second diode D2 and the second resistor R2 to the ground electric potential 7. The fifth switch S5 and a fifth resistor R5 are connected in series. The fifth resistor R5 is lower about resistance than the second resistor R2.

A malfunction detecting action of a switch of the insulation detecting apparatus having the above construction is explained. Regarding the first switch S1, in condition of making the other switches open, the second switch S2 is closed during a closed circuit time T1. When the first switch S1 is in an abnormal condition, for example, a closed circuit condition or a short circuit condition due to malfunction or etc, a circuit connecting the capacitor 9 to the power source 3 in series is formed. Thereby, during the closed circuit time T1, the capacitor 9 is charged and voltage VC between both terminals of the capacitor 9 increases. Therefore, when the third switch S3 and the fourth switch S4 are closed and the microcomputer 11 reads the voltage VC between both terminals of the capacitor 9 through A/D port (input port A/D), since the capacitor 9 is charged by abnormality of the first switch S1, the voltage VC between both terminals of the capacitor 9 is detected by the microcomputer 11. Since the voltage VC between both ends terminal of the capacitor 9 is detected, the microcomputer 11 judges that the first switch S1 is in abnormal condition.

Regarding the second switch S2, in condition of making the other switches open, the first switch S1 is closed during the closed circuit time T1. When the second switch S2 is in an abnormal condition, for example, a closed circuit condition or a short circuit condition due to malfunction, a circuit connecting the capacitor 9 to the power source 3 in series is formed. Thereby, during the closed circuit time T1, the capacitor 9 is charged and the voltage VC between both terminals of the capacitor 9 increases. Therefore, when the third switch S3 and the fourth switch S4 are closed and the microcomputer 11 reads the voltage VC between both terminals of the capacitor 9 through the A/D port, since the capacitor 9 is charged by abnormality of the first switch S1, the voltage VC between both terminals of the capacitor 9 is detected by the microcomputer 11. Since the voltage VC between both terminals of the capacitor 9 is detected, the microcomputer 11 judges that the second switch S2 is in the abnormal condition.

Regarding the third switch S3, in a condition of making the other switches open, the first switch S1 and the second switch S2 are closed during the closed circuit time T1. That is, a circuit connecting the capacitor 9 to the power source 3 in series is formed, and the capacitor 9 is charged during the closed circuit time T1. Thereby, the voltage VC of between both terminals of the capacitor 9 increases. When, after elapsing the closed circuit time T1, furthermore a prescribed time tw1 shorter than closed circuit time T1 passes, in conditions that shutting the third switch S3 off, the fourth switch S4 is closed for detecting an abnormality of the third switch S3. When the third switch S3 is in an abnormal condition, for example, a closed circuit condition or a short circuit condition due to malfunction, a circuit, which is connected with the microcomputer 11 detecting voltage VC between both ends terminal of the capacitor 9, is formed. Therewith, a discharge circuit from the capacitor 9 including the second resistor R2, the third resistor R3 and the fourth resistor R4 is formed. Therefore, when the microcomputer 11 reads the voltage VC between both terminals of the capacitor 9 through the A/D port, the A/D port of microcomputer 11 is applied the voltage VC between both terminals of the capacitor 9 by abnormality of the third switch S3. Thereby, the voltage VC between both terminals of the capacitor 9 is detected by the microcomputer 11. Since the voltage VC between both terminals of the capacitor 9 is detected, the microcomputer 11 judges that the third switch S3 is in the abnormal condition.

Regarding the fourth switch S4, in a condition of making other switches open, the first switch S1 and the second switch S2 are closed during the closed circuit time T1. That is, a circuit connecting the capacitor 9 to the power source 3 in series is formed. Thereby, the capacitor 9 is charged during the closed circuit time T1. Thereby, the voltage VC between both terminals of the capacitor 9 increases. After elapsing closed circuit time T1, furthermore after a prescribed time tw1 shorter than closed circuit time T1 passes, abnormality of the fourth switch S4 is detected. Thereby in condition of shutting the fourth switch S4 off, the third switch S3 is closed. When the fourth switch S4 is in an abnormal condition, for example, a closed circuit condition or a short circuit condition due to malfunction, a circuit, which is connected to the microcomputer 11 detecting the voltage VC between both terminals of the capacitor 9 is formed. Therewith, a discharge circuit from the capacitor 9 including the second resistor R2, the third resistor R3 and the fourth resistor R4 is formed. Therefore, when the microcomputer 11 reads the voltage VC between both terminals of the capacitor 9 through A/D port, the A/D port of the microcomputer 11 is applied the voltage VC between both terminals of the capacitor 9 by abnormality of the fourth switch S4. Thereby, the voltage of VC between both terminals of the capacitor 9 is detected by the microcomputer 11. Since the voltage VC between both terminals of the capacitor 9 is detected, the microcomputer 11 judges that the fourth switch S4 is in the abnormal condition.

After the above mentioned malfunction detecting action of each switch and a voltage detecting action for measuring insulation resistance, the fifth switch S5 is closed in condition that the third switch S3 and the fourth switch S4 are closed, and an electric charge of capacitor 9 is discharged through the second resistor R2.

For detecting a malfunction of the fifth switch S5, the first switch S1 and the second switch S2 are closed during closed circuit time T1. When the fifth switch S5 is in the closed circuit condition or the short circuit condition by malfunction, an electric charge, which is charged in the capacitor 9, is discharged through the fifth switch S5, thereby the voltage between both terminals of the capacitor 9 does not increase. When the detected voltage VC between both terminals of the capacitor 9 is equal to or lower than a prescribed voltage, the microcomputer 11 judges that the fifth switch S5 is in the abnormal condition.

Patent document 1:

Japan published patent application 2004-170146

SUMMARY OF THE INVENTION

Objects to be Solved

In the above conventional voltage detecting apparatus, when a voltage to the capacitor 9 applied by the power source 3 becomes higher for detecting a malfunction of the fifth switch S5, the voltage both terminals of the capacitor 9 does not decrease to a predetermined voltage. When increasing a voltage applied to the capacitor 9 for malfunction detection of the fifth switch S5, a charging voltage of the capacitor 9 become higher. Thereby, the voltage both terminals of the capacitor 9 does not reduce to the above predetermined voltage. In such condition, though the switch is in the malfunction, the microcomputer 11 judges that the switch is in a normal condition, so that a measurement of voltage is performed with result that a mistaken action is done.

For overcoming such problem, there is a method of discharging the capacitor 9 in a shorter time by decreasing a resistance value of the fifth resistor R5 which is connected to the fifth switch S5 in series for increasing a discharge current.

However, when the resistance value of the fifth resistor R5 is decreased, increasing rated current of the fifth resistance R5 and using a plurality of light optical MOSFETs for the fifth switch S5 are required. Thereby, it causes increase in cost by an expensive part and additions of parts. Furthermore, by getting bigger a part and a substrate, as a result there is a problem that miniaturization of the apparatus has limitations.

On the other hand, there is a method that a voltage decreases to the predetermined voltage by extending a discharge time of the fifth switch S5. But, this method has problems, which requires longer time to discharge the capacitor 9 in a normal condition, and longer measurement time.

According to the above problem, an object of the present invention is to provide a voltage detecting apparatus, which can detects a switch malfunction without cost-up, additional parts and furthermore elongation of a measuring time in normal condition, the voltage detecting apparatus to detect a voltage by using a capacitor.

How to Attain the Object of the Present Invention

According to a first aspect of the present invention, a voltage detecting apparatus has a DC (direct-current) power source, a capacitor, a voltage measuring unit, a first switch, a second switch, a third switch, a fourth switch, a fifth switch and a switch control unit. The DC power source is insulated from a ground electric potential. The capacitor stores an electric charge from the DC power source. The voltage measuring unit measures a voltage between both terminals of the capacitor. The first switch is connected between a positive electrode of the DC power source and one terminal of the capacitor. The second switch is connected between a negative electrode of the DC power source and the other terminal of the capacitor. The third switch is connected between the one terminal of the capacitor and the voltage measurement device. The fourth switch is connected between the other terminal of the capacitor and the ground electric potential. The fifth switch is connected between the one terminal of the capacitor and the ground electric potential. After storing an electric charge in the capacitor by making selectively the first switch-the fifth switch close, the switch control unit closes the third switch and the fourth switch so as to provide the voltage between both terminals of the capacitor to the voltage measurement device. Whenever the switch control unit closes the third switch and the fourth switch, the voltage measuring device measures the voltage between both terminals of the capacitor at plural times in a predetermined time interval. When a latter one of two voltages successively measured arbitrary time among from the voltages between both terminals measured above reduces a predetermined difference of voltages or more from a previous one of the two voltages, the malfunction judging unit judges that the fifth switch is in a malfunction.

According to a second aspect of the present invention, as mentioned above, when all of the measured voltages between both terminals of the capacitor by the voltage measuring unit is equal to a predetermined first threshold value or less, the malfunction judging unit judges that the fifth switch is in a malfunction.

According to a third aspect of the present invention, as mentioned above, when the voltage between both terminals of the capacitor, which is measured by the voltage measuring device after the fifth switch is opened in a predetermined period by the switch control unit, is equal to or lower than a predetermined second threshold value, the malfunction judging unit judges that the fifth switch is in a malfunction.

According to a fourth aspect of the present invention, as mentioned above, the malfunction judging unit sets a second threshold value to 0 volt.

Effect of the Invention

According to the invention, when the voltage measuring device measures the voltage between both terminals at plural times, and when the latter one of the two voltages successively measured arbitrary time among from the voltages between both terminals measured above reduces a predetermined difference of voltages from the previous one of the two voltages, the malfunction judging unit judges that the fifth switch is in the malfunction. Therefore, the fifth switch and the discharge circuit do not require additional parts and expensive parts. In addition, a discharge time does not need to be extended, so as to effect a measuring time in normal condition.

According to the invention, when the measured voltage between both terminals of the multiple capacitors in the voltage measurement unit is equal to or less than the predetermined first threshold value, the malfunction judging unit determines that fifth switch is in a malfunction. That is, when the voltage between both terminals of capacitor is low, the malfunction judging unit judges the malfunction of the fifth switch, so can judge that fifth switch is malfunction with accuracy.

According to the invention, as mentioned above, the fifth switch is opened during the prescribed time by the switch control unit. Then, when the measured voltage between both terminals of the capacitor by the voltage measuring device is equal to the predetermined second threshold value or less, the malfunction judging unit judges that the fifth switch is in a malfunction. That is, when the capacitor is discharged completely, the malfunction judging unit can judges malfunction of the fifth switch more accurately.

According to the invention, the malfunction judging unit sets the second threshold value to 0 volt. The malfunction judging unit can judge the malfunction of the fifth switch by judging whether the voltage between both terminals of capacitor is equal to 0 or not. That is, the capacitor is discharged completely, and thereby the malfunction of the fifth switch can be judged.

The above and other objects and features of this invention will become more apparent from the following description taken in conjunction with the accompanying drawings.

DESCRIPTION OF THE PREFERRED EMBODIMENT

Figure 1:
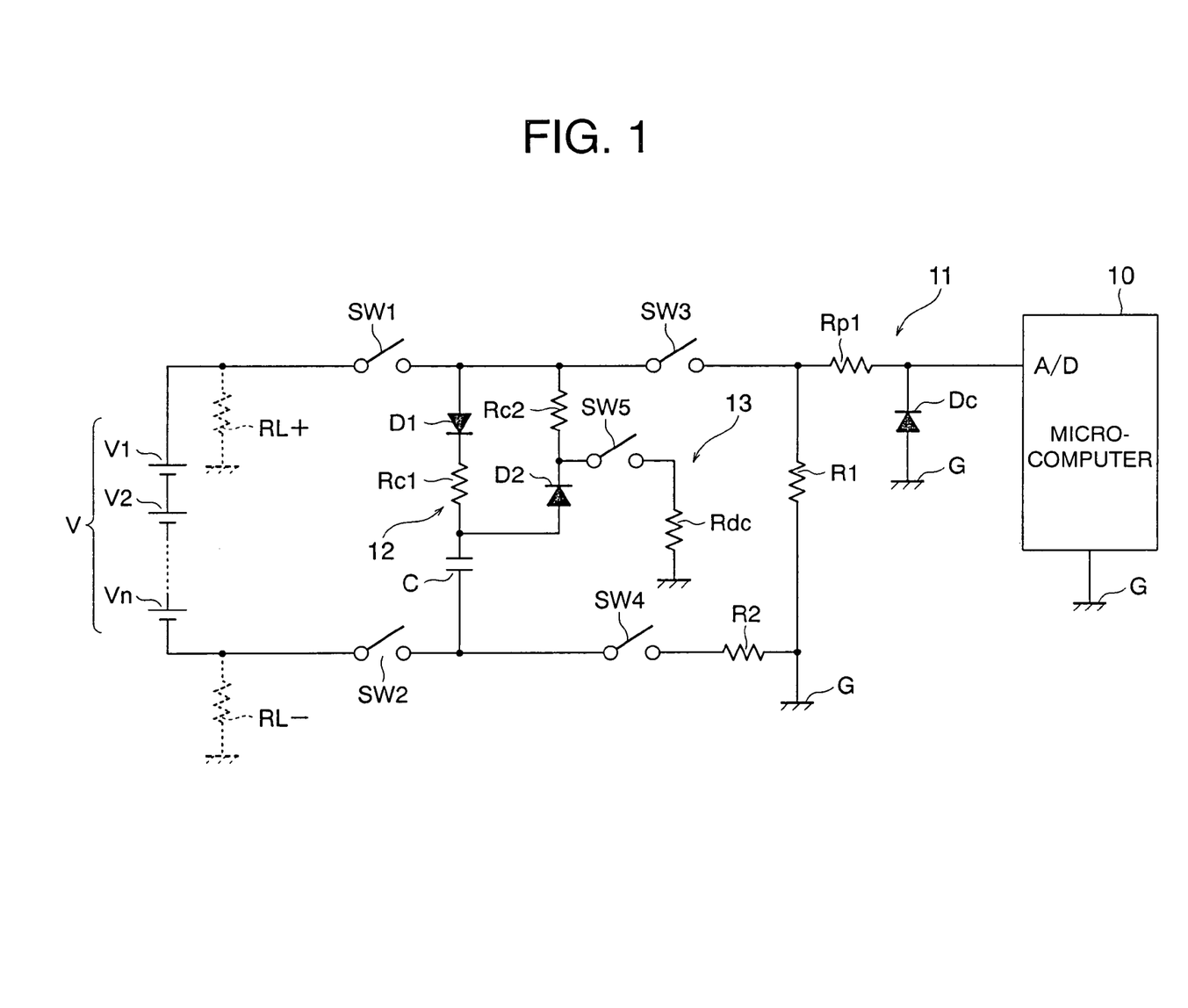
FIG. 1 is a circuit diagram of an embodiment of a voltage detecting apparatus according to the present invention.

Embodiments of the present invention are explained by referring to drawings. FIG. 1 is a circuit diagram of an embodiment of an insulation detecting apparatus as a voltage detecting apparatus of the present invention. A high-voltage power source V as a DC (direct-current) power source is formed by connecting batteries of numbers N in series and is insulated from a ground electric potential G of a low-voltage system, including a microcomputer 11.

As shown in FIG. 1, the insulation detecting apparatus has a capacitor C, a microcomputer 10, a first switch SW1, a second switch SW2, a third switch SW3, a fourth switch SW4, a first resistor R1, a second resistor R2, a protecting circuit 11, a resistance select circuit 12, and a reset circuit 13.

The capacitor C is a bipolar-type capacitor for measuring a voltage of the high-voltage power source V by a Flying capacitor method The microcomputer 10 as a malfunction judging unit, a switch control unit and a voltage measuring device contains a memory. Furthermore, the microcomputer 10 has a voltage measurement function, a ground resistance calculating function, a switch control function and a malfunction judging function for each switch. The voltage measurement function converts a provided voltage to an input terminal A/D analog-to-digital and measures the voltage. The ground resistance calculating function calculates a ground resistance by a prescribed formula and a conversion table with the measured voltage by voltage measurement function. The switch control function performs to open and close of each switch when performing the voltage measurement function.

The first switch SW1 connects a positive electrode of an insulated high-voltage power source V to one terminal of the capacitor C. The second switch SW2 connects a negative electrode of the high-voltage power source V to the other terminal of the capacitor C.

The third switch SW3 connects the one terminal of the capacitor C to the input terminal A/D. A fourth switch SW4 connects the other terminal of the capacitor C to the ground electric potential G.

For the each above mentioned first-fourth switches SW1-SW4, an optical MOSFET is used and insulated from a high-voltage power source V, and can be controlled by the microcomputer 10.

The first resistor R1 is set up between a terminal, near side to the input terminal A/D, of the third switch SW3 and the ground electric potential G. The second resistor R2 is arranged between a terminal, near side to the ground electric potential G, of the fourth switch SW4 and the ground electric potential G.

The protecting circuit 11 has a protection resistor Rp1 and a clamp diode Dc. The input terminal A/D of the microcomputer 10 is supplied with a voltage through the protecting circuit 11.

The protection resistor Rp1 is arranged between a terminal, nearer to the third switch SW3, of the first resistor R1 and the input terminal A/D of microcomputer 10, and works as a current limiting resistor, and prevents the input terminal A/D of the microcomputer 10 from flowing an over current therethrough. The clamp diode Dc is arranged between a terminal, near to the input terminals A/D, of the protection resistor Rp1 and the ground electric potential G. The clamp diode Dc prevents the input terminal A/D of the microcomputer 10 from an excessive positive or negative voltage therein to possibly damage the microcomputer 10.

The resistance select circuit 12 has a first diode D1, a first select resistor Rc1, a second diode D2 and a second select resistor Rc2. The resistance select circuit 12 is arranged between a line connecting the first switch SW1 with the third switch SW3 and the capacitor C.

The first diode D1 is connected in a forward direction from the line connecting the first switch SW1 and the third switch SW3 toward a capacitor C. The first select resistor Rc1 is connected between the first diode D1 and the capacitor C in series.

The second diode D2 is connected in the forward direction from the capacitor C toward the line connecting the first switch SW1 and the third switch SW3. That is, the second diode D2 is connected in a direction opposite to that of the first diode D1. The second select resistor Rc2 is connected between the second diode D2 and the line connecting the first switch SW1 with the third switch SW3 in series.

The resistance select circuit 12 is formed by connecting two circuits in parallel. One of the two circuits connects the first diode D1 and the first select resistor Rc1 in series. The other of the two circuits connects the second diode D2 and the second select resistor Rc2 in series.

That is, the first diode D1 and the second diode D2 choose one from the first select resistor Rc1 and the second select resistor Rc2, which corresponds to a direction of polarity of the capacitor C. Thereby, the selected select resistor is electrically connected between the line connecting the first switch SW1 with the third switch SW3 and the capacitor C.

The reset circuit 13 has a reset switch SW5 as a fifth switch and a discharge resistor Rdc. The reset switch SW5 is controlled by the microcomputer 10. When the reset switch SW5 is closed, an electric charge stored in the capacitor C can be discharged immediately.

The discharge resistor Rdc is set at a lower value than the first resistor R1, the second resistor R2 and the first select resistor Rc1.

Figure 2:
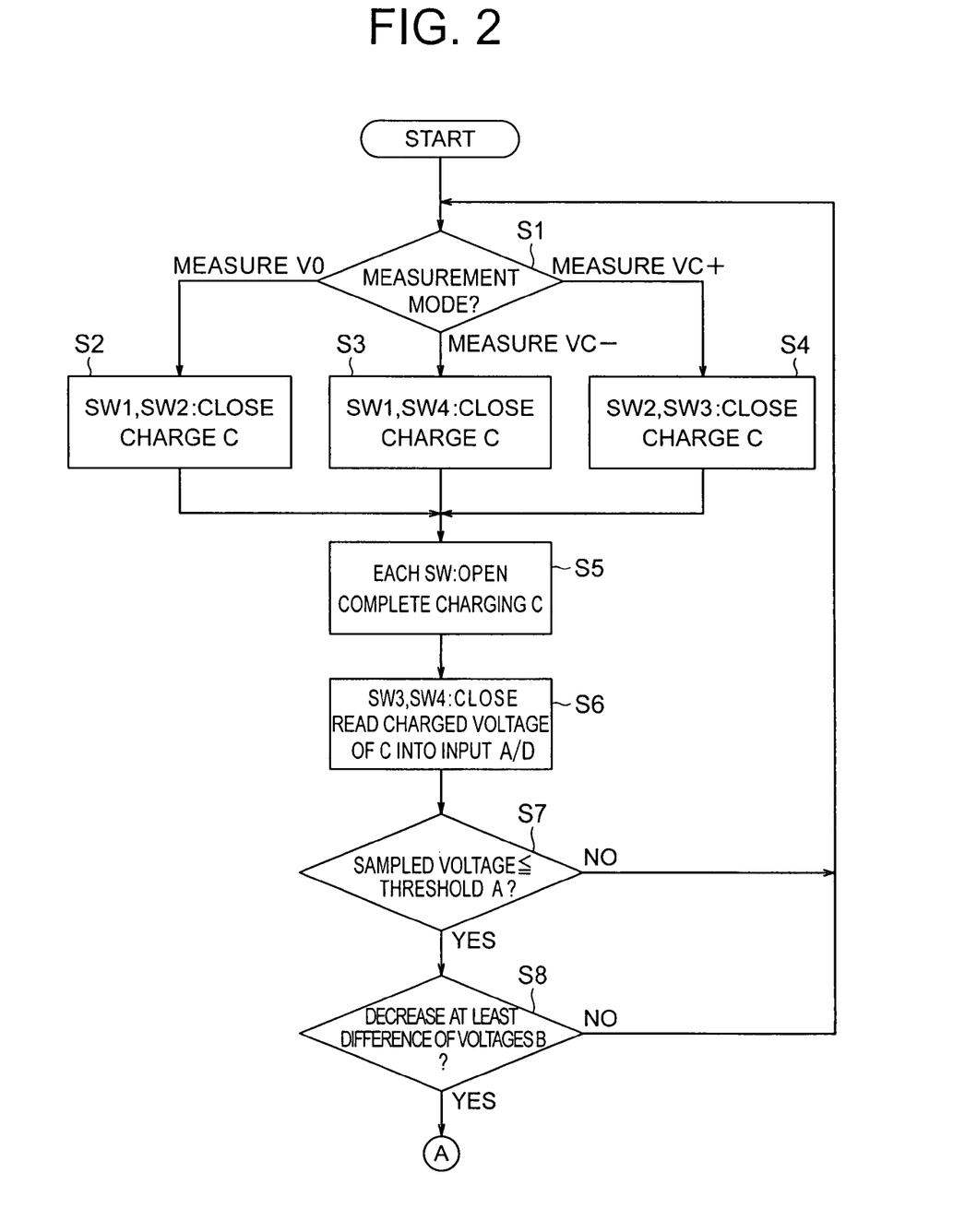
FIG. 2 is one part of a flowchart showing method processing the malfunction of the switch at the voltage detecting apparatus of FIG. 1.
Figure 3:
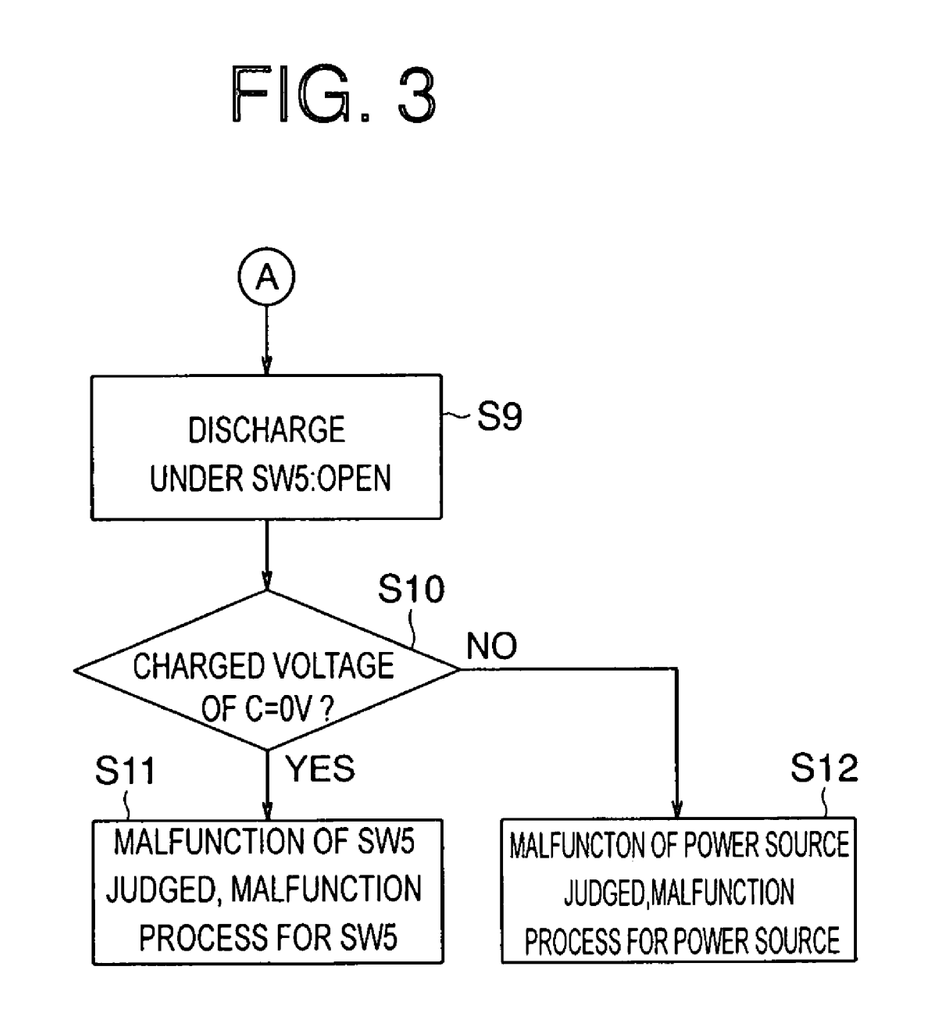
FIG. 3 is the other of the flowchart showing method processing the malfunction of the switch at the voltage detecting apparatus of FIG. 1.

A voltage measuring action of the insulation detecting apparatus of the present invention having the above structure is explained by referring to a flowchart in FIG. 2 and FIG. 3.

In step S1, a measuring mode is decided, and then when measuring V0, the step S1 proceeds to the step S2. When measuring VC−, the step S1 proceeds to the step S3. When measuring VC+, the step S1 proceeds to the step S4. In this step, a decision of the measuring mode can be decided preliminarily about order of measuring or decided by receiving instructions from outside in each step.

In Step S2, for measuring a high voltage of a high voltage power source V, that is, for measuring a voltage between both terminals V0, the microcomputer 10 makes the first switch SW1 and the second switch SW2 close during a charging time T1 from an initial condition that all switches is opened. Thereafter, the step 2 proceeds to the step S5. The charging time T1 is set to a shorter time than a required time in which the capacitor C is full-charged. Accordingly, a closed circuit is formed by the positive electrode of the high-voltage power source V, the first switch SW1, the first diode D1, the first select resistor Rc1, the capacitor C, the second switch SW2 and the negative electrode of the high-voltage power source. The capacitor C is charged with the voltage between both terminals V0 of the high-voltage power source V. At this time, the capacitor C is charged in a condition floated from the ground electric potential G.

In step S3, for measuring a voltage VC− corresponding to value of a negative-electrode-side ground resistance RL−, the microcomputer 10 makes the first switch SW1 and the fourth switch SW4 close during the charging time T1. Then, the step S3 proceeds to the step S5. Accordingly, a closed circuit is formed by the positive electrode of the high-voltage power source V, the first switch SW1, the first diode D1, the first select resistance Rc1, the capacitor C, the fourth switch SW4, the second resistor R2, the ground electric potential G, the negative-electrode-side ground resistance RL− of a high-voltage power source V and the negative electrode of the high-voltage power source V. The capacitor C is charged with a voltage corresponding to the value of the negative-electrode-side ground resistance RL−.

In step S4, for measuring a voltage VC+ corresponding to a value of positive-electrode-side ground resistance RL+, the microcomputer 10 makes the second switch SW2 and the third switch SW3 close during the charging time T1. Then the step S4 proceeds to the step S5. Accordingly, a closed circuit is formed by the positive electrode of the high-voltage power source V, the ground resistance RL+ at a positive electrode side, the ground electric potential G, the first resistor R1, the third switch SW3, the first diode D1, the first select resistor Rc1, the capacitor C, the second switch SW2 and the negative electrode of the high-voltage power source V. The capacitor C is charged with a voltage according corresponding to a value of the positive-electrode-side ground resistance RL+.

In step 5, the microcomputer 10 controls a closed switch open and finishes charging for the capacitor C. Then the step 5 proceeds to the step S6.

Figure 4:
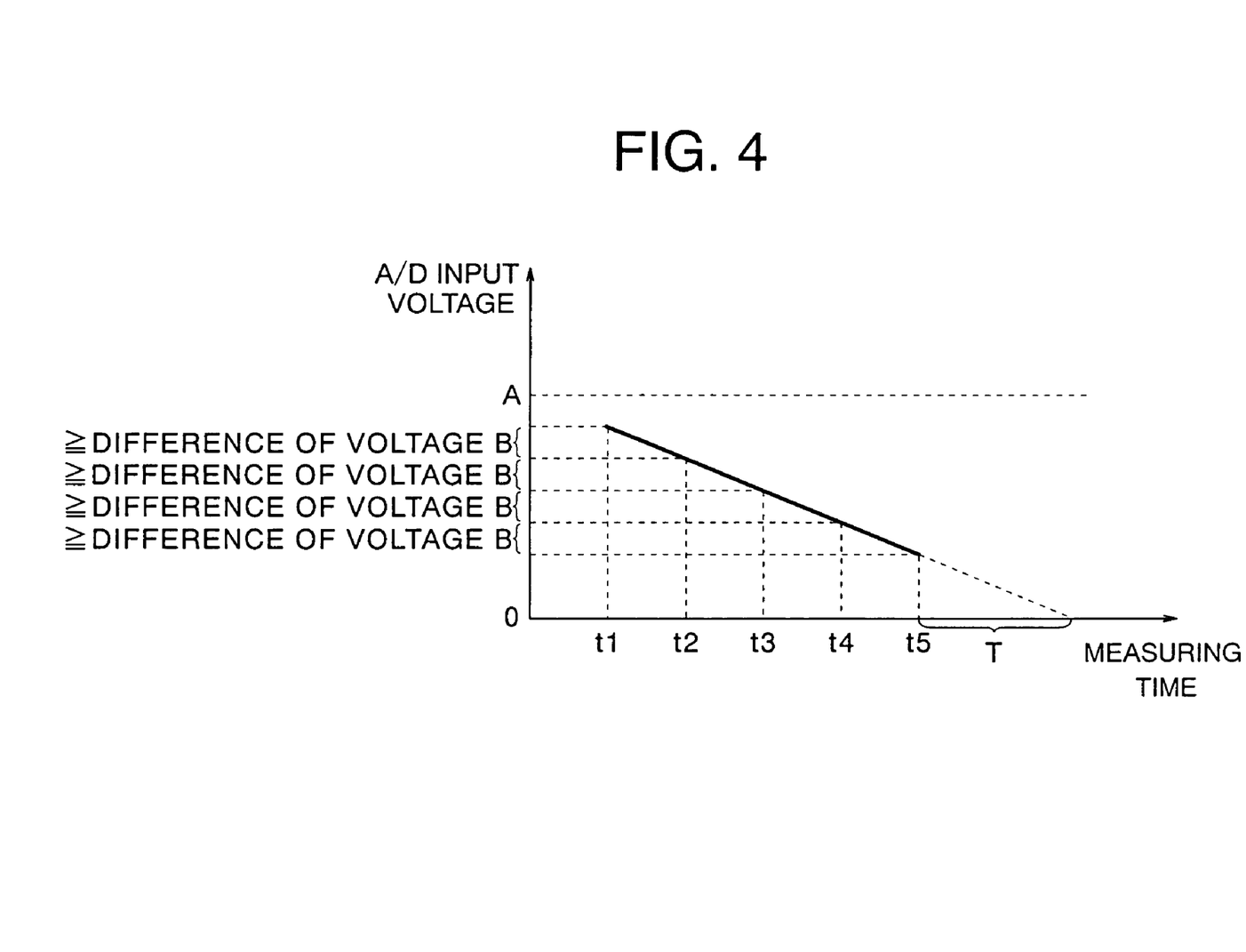
FIG. 4 is a graph showing an example of changing of the voltage between both terminals of the capacitor when the fifth switch is in malfunction.

In step S6, the third switch SW3 and the fourth switch SW3 are closed. The step S6 proceeds to the step 7. Accordingly, a closed circuit is formed by the capacitor C, the second diode D2, the second select resistor Rc2, the third switch SW3, the first resistor R1, the second resistor R2 and the fourth switch SW4. A voltage corresponding to the voltage between both terminals of the capacitor 9 is provided to the input terminal A/D of the microcomputer 10 and is read therein. In this case, as shown in FIG. 4, the voltage corresponding to the voltage between both terminals of the capacitor C is read in at least once (in FIG. 4, five times of t1 to t5) in a predetermined time interval (by sampling). That is, whenever the third switch SW3 and the fourth switch SW4 are closed, the microcomputer 10 measures the voltage between both terminals of the capacitor C plural times in a predetermined time interval.

In step S7, the microcomputer 10 judges whether or not all of values corresponding to the voltage between both terminals of the capacitor C, which sampled plural times in step S6, is equal to or lower than a predetermined threshold value A as a first threshold. When the all values corresponding to the voltage between both terminals is equal to or lower than the predetermined threshold value A, the step 7 proceeds to the step S8. When the value corresponding to the voltage between both terminals is not equal to or higher than the predetermined threshold value A, the step 7 returns to the step 1. The predetermined threshold value A is set in a voltage value possibly to be caused by a short-circuit malfunction of fifth switch SW5.

In step S8, the microcomputer 10 judges whether or not the value corresponding to the voltage between both terminals of the capacitor C, which sampled plural times in step S6, decreases at least a prescribed difference B of successive voltages in sampling order, as shown in FIG. 4. When the voltage decreases with a value equal to or larger than the difference of voltages B, the step 8 proceeds to the step S9. In an opposite condition, the step S8 returns the step S1. That is, it is judged whether or not a latter one of two successive voltages of all measured voltages between both terminals decreases with the value equal to or larger than the predetermined difference of voltages against a previous one of the two successive voltages.

Explaining physically in FIG. 4, when comparing a sampled input A/D voltage at time t1 with a sampled input A/D voltage at time t2, the sampled input A/D voltage at time t2 decreases at least the difference of voltages B from the sampled input A/D voltage at time t1, and comparing the sampled input A/D voltage at time t2 with a sampled input A/D voltage at time t3, the sampled input A/D voltage at time t3 decrease at least the difference of voltages B from the sampled input A/D voltage at time t2, and comparing the sampled input A/D voltage at time t3 with a sampled input A/D voltage at time t4, the sampled input A/D voltage at time t4 decreases at least the difference of voltages B from the sampled input A/D voltage at time t3, and comparing the sampled input A/D voltage at time t4 with a sampled input A/D voltage at time t5, the sampled input A/D voltage at time t5 decreases at least the difference of voltage B from the sampled input A/D voltage at time t4, the step S8 proceeds to the step S9. Although the sampling number of times is set to five times in FIG. 4, the sampling number of times can perform at least two times.

In Step 9, while a fifth switch SW5 is opened, discharging is acted during a predetermined time T. After that, the step S9 proceeds to the step S10. The predetermined time T is a time for discharging the capacitor C in a normal condition. More specifically, discharging, which is performed while a fifth switch SW5 is closed in the normal action, is performed while a fifth switch SW5 is opened.

In step S10, a value corresponding to the voltage between both terminals of the capacitor C is read in. It is judged whether or not the value is 0 volt, as a second threshold value. When the value is 0 volt, the step S10 proceeds to the step S11. When the value is not 0 volt, step S10 proceeds to the step S12. In the step, it is judged whether or not the capacitor C is completely discharged in condition of an opened fifth switch. The second threshold value is set to 0 volt, which is read in a microcomputer 10 when a capacitor C is completely discharged. Substantial 0 volt can be also used for the second threshold value in consideration of measurement error.

In step S11, the capacitor C is completely discharged, thereby the fifth switch is judged as a malfunction. Malfunction process including stop of a measurement action and alarm to outside of an insulation detecting apparatus is performed.

In step S12, the capacitor C is not completely discharged, thereby it is judged that the fifth switch SW5 is not in a malfunction, but the high-voltage power source V is in a malfunction. Therefore, the measurement action is maintained and monitoring the high-voltage power source V is continued. Furthermore, alarm to the outside of the insulation detecting apparatus can be performed.

When the process returns from the Step S7 and the step S8 to the step 1, and the voltage between both terminals V0 of the high-voltage power source V, the ground resistance RL− of the negative electrode side and the ground resistance RL+ of the positive electrode side are measured, a ground resistance is calculated to refer a value, which is calculated at a formula of $((VC-)+(VC+))/V0$, in a conversion table stored in a memory of the microcomputer 10.

According to the above insulation detecting apparatus, when the microcomputer 10 measures the voltage between both terminals of the capacitor C plural times, the sampled voltages are equal to or lower than a predetermined threshold value A, and the voltages in sampling order decrease at least the predetermined difference of voltages B (each measured voltage decreases at least the difference of voltages B from the voltage measured previously in sampling order). In addition, while a fifth switch SW5 is opened, the discharge process is performed during a predetermined time. Thereby, when the voltage between both terminals of the capacitor C becomes 0 volt, it is judged that the fifth switch SW5 is in an abnormal condition the sampled voltages are equal to or lower than the predetermined threshold value A, and the voltages in sampling order decrease at least the predetermined difference of voltages B, it is highly possible that the fifth switch SW5 is short circuit and the capacitor C is discharged. While the fifth switch SW5 is opened, the discharge process is performed during the predetermined time. By judging that the voltage between both terminals of the capacitor C becomes 0 volt, the malfunction of fifth switch SW5 can be detected securely.

In addition, according to the above threshold value A, the difference of voltages B and the voltage between both terminals of a capacitor C to become 0 volt, the malfunction of the fifth switch SW5 is detected. Thereby, it is not required to increase in cost and use additions parts. Furthermore it is possible to detect malfunction of the switch without effect the measuring time in the normal condition.

As shown in the flowchart of FIG. 2, as for voltage values of three modes in step S2, step S3 and step S4, it is judged whether or not the fifth switch SW5 is in a malfunction, and then there should be at least only step S2. That is, not limiting a voltage related to an insulation resistance and a ground resistance, a voltage of DC (direct-current) power source is measured several times. The sampled voltages are equal to or lower a predetermined first threshold value, and the voltage decreases at least a predetermined difference of voltages in order of sampling. Furthermore, while the fifth switch is opened, the discharge process is performed during the predetermined time. Thereby, when the voltage between both terminals of the capacitor C becomes 0 volt, it is judged that the fifth switch SW5 is in the abnormal condition.

In the above embodiment, when abnormality occurs, measurement of voltage is stopped after notifying alarm and discharging the capacitor C. The measurement can continue without stopping.

For example, a predetermined threshold value A is set to a higher voltage than the embodiment, and the difference of voltages B is changed to a small value. By eliminating the process of the discharge process during a predetermined time T while the fifth switch SW5 is opened (step S9), or by setting criterion for judgment after the step S9 process to a larger voltage than 0 volt, a lighter malfunction than the short-circuit of the fifth switch SW5, which is detected in the embodiment including a layer short and an insulation degradation other than the complete short-circuit, an be detected.

A judgment of a malfunction of the fifth switch SW5 allows that the voltage only decreases at least a predetermined difference of voltages B in order of sampling. Also a judging that the sampled plural voltages are at most threshold value A (step S7) or performing the discharge process while fifth switch SW5 is opened during predetermined time T can be combined with the above judgment.

While the invention has been described with reference to specific embodiments, the description is illustrative and not to be construed as limiting the scope of the invention. That is to say, various changes and modifications can be made without departing from the scope of the invention as defined by the following claims.

While, in the embodiment, the present invention is described, it is not limited thereto. Various change and modifications can be made with the scope of the present invention.

What is claimed is:

1. A voltage detecting apparatus comprising:
a DC (direct-current) power source, insulated from a ground electric potential;
a capacitor storing electric charge from the DC power source;
a voltage measuring device for measuring voltage between both terminals of the capacitor;
a first switch connected between a positive electrode of the DC power source and one terminal of the capacitor;

a second switch connected between a negative electrode of the DC power source and the other terminal of the capacitor;

a third switch connected between the one terminal of the capacitor and the voltage measuring device;

a protecting circuit connected between the third switch and the voltage measuring device, the protecting circuit comprising a resistor connected in series with a clamp diode, one end of the diode being connected to ground, wherein the resistor limits current flow to the voltage measuring and the diode prevents excess voltage from being applied to the voltage measuring device;

a fourth switch connected between the other terminal of the capacitor and the ground electric potential;

a fifth switch connected between the one terminal of the capacitor and the ground electric potential;

a switch control unit providing voltage between both terminals of the capacitor to the voltage measuring device in condition that the third switch and the fourth switch are closed after the capacitor is stored the electric charge while the first to fifth switches were closed selectively; and a malfunction judging unit for judging a malfunction of the fifth switch, wherein whenever the switch control unit closes the third switch and the fourth switch, the voltage measuring device measures the voltage between both terminals of the capacitor at plural times in a prescribed time interval, and when a latter one of two voltages successively measured arbitrary time among from the voltages between both terminals measured above reduces a predetermined difference of voltages from a previous one of the two voltages, the malfunction judging unit judges that the fifth switch is in a malfunction.

2. The voltage detecting apparatus as claimed in claim 1, wherein the malfunction judging unit judges that the fifth switch is in a malfunction when all of the plural voltages between both terminals of the capacitor measured by the voltage measuring device is equal to or lower than a predetermined first threshold value.

3. The voltage detecting apparatus as claimed in claim 1, wherein, when the voltage between both terminals of the capacitor, which is measured by the voltage measuring device after the fifth switch is opened in a predetermined period by the switch control unit, is equal to or lower than a predetermined second threshold value, the malfunction judging unit judges that the fifth switch is in a malfunction.

4. The voltage detecting apparatus as claimed in claim 3, wherein the malfunction judging unit sets the second threshold value to 0 volt.

5. The voltage detecting apparatus as claimed in claim 2, wherein, when the voltage between both terminals of the capacitor, which is opened in a predetermined period by the switch control unit, is equal to or lower than a predetermined second threshold valued, the malfunction judging unit judges that the fifth switch is in a malfunction.

6. The voltage detecting apparatus as claimed in claim 5, wherein the malfunction judging unit sets the second threshold value to 0 volt.

\* \* \* \* \*